United States Patent
Durnan et al.

(10) Patent No.: US 9,705,491 B1
(45) Date of Patent: Jul. 11, 2017

(54) APPARATUS AND METHOD FOR SUPPLYING POWER TO PORTION OF INTEGRATED CIRCUIT VIA WEAK-STRONG AND STRONG-ONLY SWITCH CELLS

(71) Applicant: QUALCOMM Incorporated, San Diego, CA (US)

(72) Inventors: Shaun Durnan, Hilton (GB); Martin Johansson, Ely (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/158,236

(22) Filed: May 18, 2016

(51) Int. Cl.
  *G05F 1/10* (2006.01)
  *H03K 17/687* (2006.01)
  *G06F 17/50* (2006.01)

(52) U.S. Cl.
  CPC ..... *H03K 17/6871* (2013.01); *G06F 17/5077* (2013.01)

(58) Field of Classification Search
  CPC .......................... H03K 17/6871; G06F 17/5077
  See application file for complete search history.

(56) References Cited

U.S. PATENT DOCUMENTS

| | | | | |
|---|---|---|---|---|
| 7,142,019 B2* | 11/2006 | Mair | .................... | H03K 17/164 326/33 |
| 7,659,746 B2 | 2/2010 | Chua-Eoan et al. | | |
| 7,782,701 B2* | 8/2010 | Seo | .......................... | G11O 5/14 365/226 |
| 8,015,419 B2* | 9/2011 | Rowhani | ................... | G06F 1/26 326/102 |
| 8,519,775 B2 | 8/2013 | Idgunji et al. | | |
| 8,542,054 B2 | 9/2013 | Takayanagi et al. | | |
| 2015/0355662 A1 | 12/2015 | Myers et al. | | |

* cited by examiner

*Primary Examiner* — Kenneth B Wells
(74) *Attorney, Agent, or Firm* — Loza & Loza, LLP/Qualcomm

(57) ABSTRACT

A power gating circuit including a set of weak-strong switch cells and strong-only switch cells daisy chained together. Each of the weak-strong cell is layout (footprint) compatible with the strong-only cell such that swapping a weak-strong cell for a strong-only cell or vice-versa during the design phase of the power gating circuit does not affect routing to or the timing operation of the circuit to which the power gating circuit supplies power. This allows the ratio of weak to strong switches for minimizing in-rush currents to be optimally set during the design phase of an IC. Each of the weak-strong cells couples power rails together via a weak transistor in response to a weak enable signal, and via a strong transistor in response to a strong enable signal. Each of the strong-only cell couples the power rails together via weak and strong transistors in response to the strong enable signal.

16 Claims, 9 Drawing Sheets

APPARATUS AND METHOD FOR SUPPLYING POWER TO PORTION OF INTEGRATED CIRCUIT VIA WEAK-STRONG AND STRONG-ONLY SWITCH CELLS

BACKGROUND

Field

Aspects of the present disclosure relate generally to power gating circuits, and in particular, to an apparatus and method for supplying power to portion of an integrated circuit (IC) using weak-strong switch cells and strong-only switch cells, as well as method of designing power gating circuits.

Background

A power gating circuit is used for coupling a terminal voltage rail (TVDD) to an internal voltage rail (VDD) of an integrated circuit (IC). The terminal voltage rail (TVDD) receives an external supply voltage from a battery, regulator, or other type of source. The power gating circuit applies the external supply voltage to a portion (e.g., core or module) of the IC by electrically coupling the terminal voltage rail (TVDD) to the internal voltage rail (VDD).

A power gating circuit typically includes a set of switch cells for separately coupling the terminal voltage rail (TVDD) to the internal voltage rail (VDD). The set of switch cells typically include a subset of weak switch cells and a subset of strong switch cells. To limit an in-rush current, the weak switch cells are turned on first to allow the internal power rail (VDD) to partially charge up. Then, the strong switch cells are turned on to fully couple the terminal voltage rail (TVDD) to the internal voltage rail (VDD) such that the power gating circuit is able to supply the total demand for current (e.g., dynamic current) of the portion (e.g., core or module) of the IC.

Generally, there is a particular ratio of weak switch cells to strong switch cells (or total switch cells) that produces minimized in-rush current peaks. In the design phase of a power gating circuit, the ratio is estimated based on the design of the portion (e.g., core or module) of the IC. If the estimated ratio proves to be inaccurate, the power gating circuit needs to be redesigned by swapping weak switch cells for strong switch cells or vice-versa. Such swapping of cells requires re-routing of the connection of the power gating circuit to the IC portion, and performing timing analysis of the operation of the IC portion. Such interplay between redesigning the power gating circuit, re-routing, and timing analysis complicates the design of the IC, and often results in not achieving the optimal ratio of weak switch cells to strong switch cells (or total switch cells).

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a set of first-type switch cells, wherein each of the first-type switch cells is configured to couple a first power rail to a second power rail via a first relatively weak transistor in response to a first enable signal, and couple the first power rail to the second power rail via a first relatively strong transistor in response to a second enable signal; and a set of second-type switch cells, wherein each of the second-type switch cells is configured to couple the first power rail to the second power rail via a second relatively weak transistor and a second relatively strong transistor in response to the first enable signal.

Another aspect of the disclosure relates to a method of designing a power gating circuit for supplying power to a particular circuit. The method includes generating a first design of a power gating circuit by populating cell slots with at least one of a set of first-type of switch cells or a set of second-type switch cells, wherein each of the first-type switch cell is configured to weakly couple a first power rail to a second power rail in response to a first enable signal, and wherein each of the first-type switch cell and each of the second-type switch cell is configured to strongly couple the first power rail to the second power rail in response to a second enable signal; determining a ratio of the first-type switch cells to second-type switch cells; and generating a second design of the power gating circuit by swapping at least one of the first-type switch cells for at least one of the second-type switch cells or swapping at least one of the second-type switch cells for at least one of the first-type switch cells to achieve the ratio.

Another aspect of the disclosure relates to an apparatus including first means for coupling a first power rail to a second power rail via a first relatively weak transistor in response to a first enable signal, and coupling the first power rail to the second power rail via a first relatively strong transistor in response to a second enable signal; and second means for coupling the first power rail to the second power rail via a second relatively weak transistor and a second relatively strong transistor in response to the second enable signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

During a power up operation of a portion (e.g., core or module) of an integrated circuit (IC), a supply voltage on a terminal power rail (TVDD) is applied to an internal power rail (VDD) via a power gating circuit. A power gating circuit typically includes a mixture of relatively weak switches (e.g., weak field effect transistors (FETs)) and relatively strong switches (e.g., strong FETs).

The power gating circuit is configured in this manner to prevent a large in-rush current if otherwise all the switches were turned on at the same time during a power up operation. Such large in-rush current may cause the IC to reset and may cause permanent damage to the IC, due to, for example, electromigration.

During a power up operation, the power gating circuit is configured to turn on the weak switches first to maintain a peak of an initial in-rush current below a certain threshold. Once the initial in-rush current has peaked and then settled to a particular level well below the threshold, the power gating circuit is configured to turn on the strong switches so that the power gating circuit is able to meet the total (e.g., dynamic) current demand of the portion of the IC to which it supplies power.

During a power up operation, two peaks of in-rush current are observed. One peak occurs in response to turning on of the weak switches and the other peak occurs in response to turning on of the strong switches. It is generally desirable that both peaks of the in-rush current are substantially equalized to achieve peaks below a desired safety threshold. As discussed in more detail below, the ratio of weak switches to strong switches determines the magnitudes of the respective peaks.

Figure 1A:
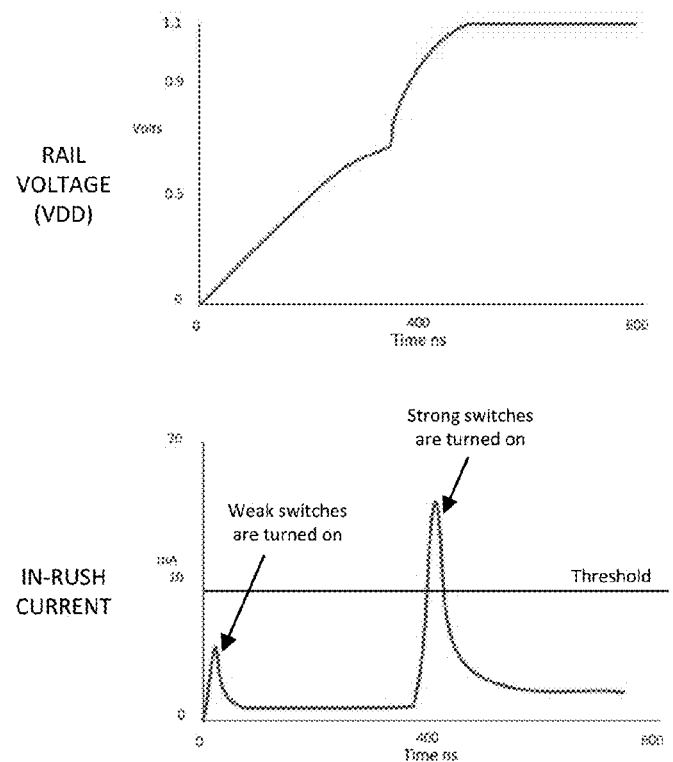
FIG. 1A illustrates a pair of graphs of an internal rail voltage VDD and a corresponding in-rush current versus time for a case where the ratio of weak switches to strong switches is too low in accordance with an aspect of the disclosure.

FIG. 1A illustrates a pair of graphs of an internal rail voltage VDD (e.g., from 0 to 1.1V) and a corresponding in-rush current (e.g., from 0 to 20 milliamps (ma)) versus time for a case where the ratio of weak switches to strong switches is too low (in other words, there is an insufficient number of weak switches). In such case, when the weak switches are turned on, a small in-rush current peak occurs, which is well below a defined safety threshold. However, when the strong switches are subsequently turned on, a large in-rush current peak occurs, which may be well above the desired safety threshold. The large peak current occurs because there are too few weak switches to sufficiently charge the internal power rail (VDD) before the strong switches are turned on.

Figure 1B:
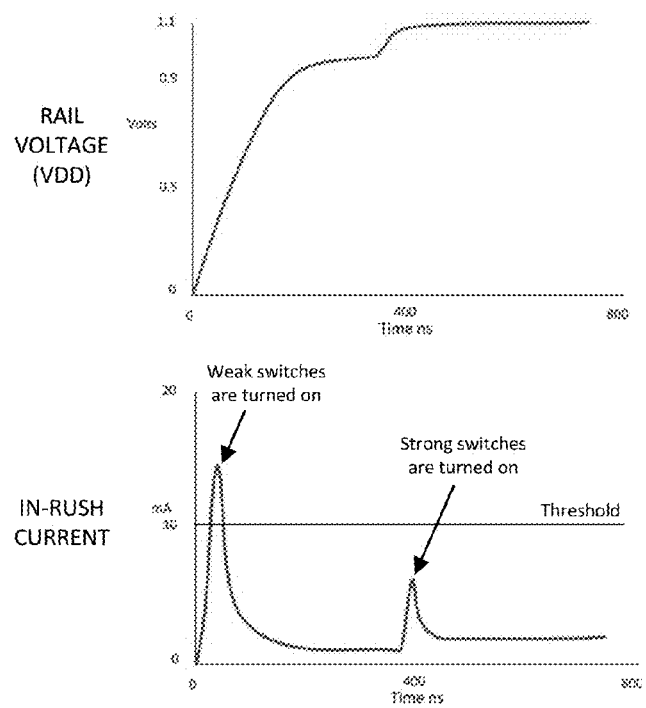
FIG. 1B illustrates a pair of graphs of the internal rail voltage VDD and the corresponding in-rush current versus time for a case where the ratio of weak switches to strong switches is too large in accordance with another aspect of the disclosure.

FIG. 1B illustrates a pair of similar graphs of the internal rail voltage VDD and the corresponding in-rush current versus time for a case where the ratio of weak switches to strong switches is too large (in other words, there are too many weak switches). In such case, when the weak switches are turned on, a large in-rush current peak occurs, which is well above the defined safety threshold. However, the subsequent turning on of the strong switches results in an in-rush current peak well below the defined safety threshold.

Figure 1C:
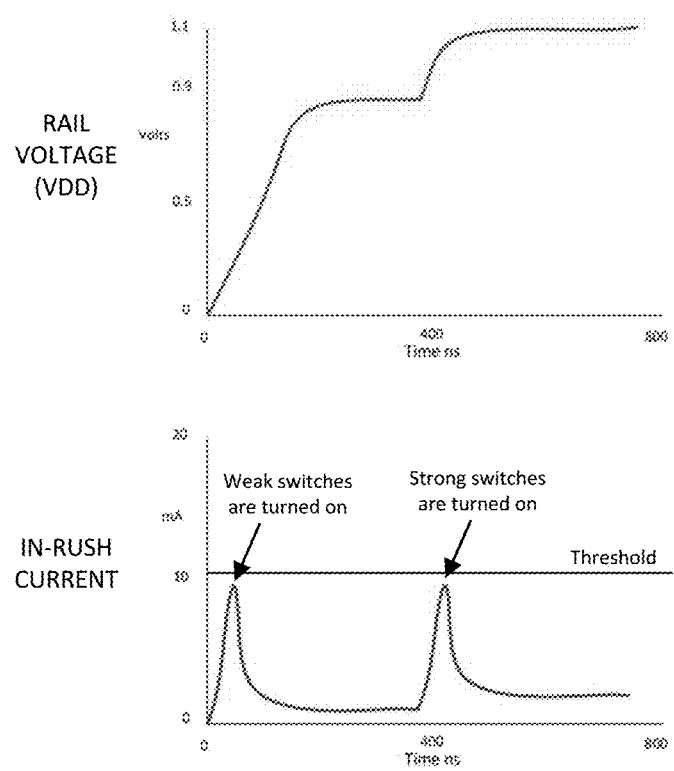
FIG. 1C illustrates a pair of graphs of the internal rail voltage VDD and the corresponding in-rush current versus current for a case where the ratio of weak switches to strong switches is set to produce substantially equalized in-rush current peaks in accordance with another aspect of the disclosure.

FIG. 1C illustrates a pair of similar graphs of the internal rail voltage VDD and the corresponding in-rush current for a case where the ratio of weak switches to strong switches is set to produce substantially equalized in-rush current peaks. In such a case, the turning on of the weak switches results in an in-rush current peak that is substantially equalized with the in-rush current peak resulting from the turning on of the strong switches. In such a case, both current peaks may be below the defined safety threshold to prevent resetting of and damage to the IC.

Figure 2:
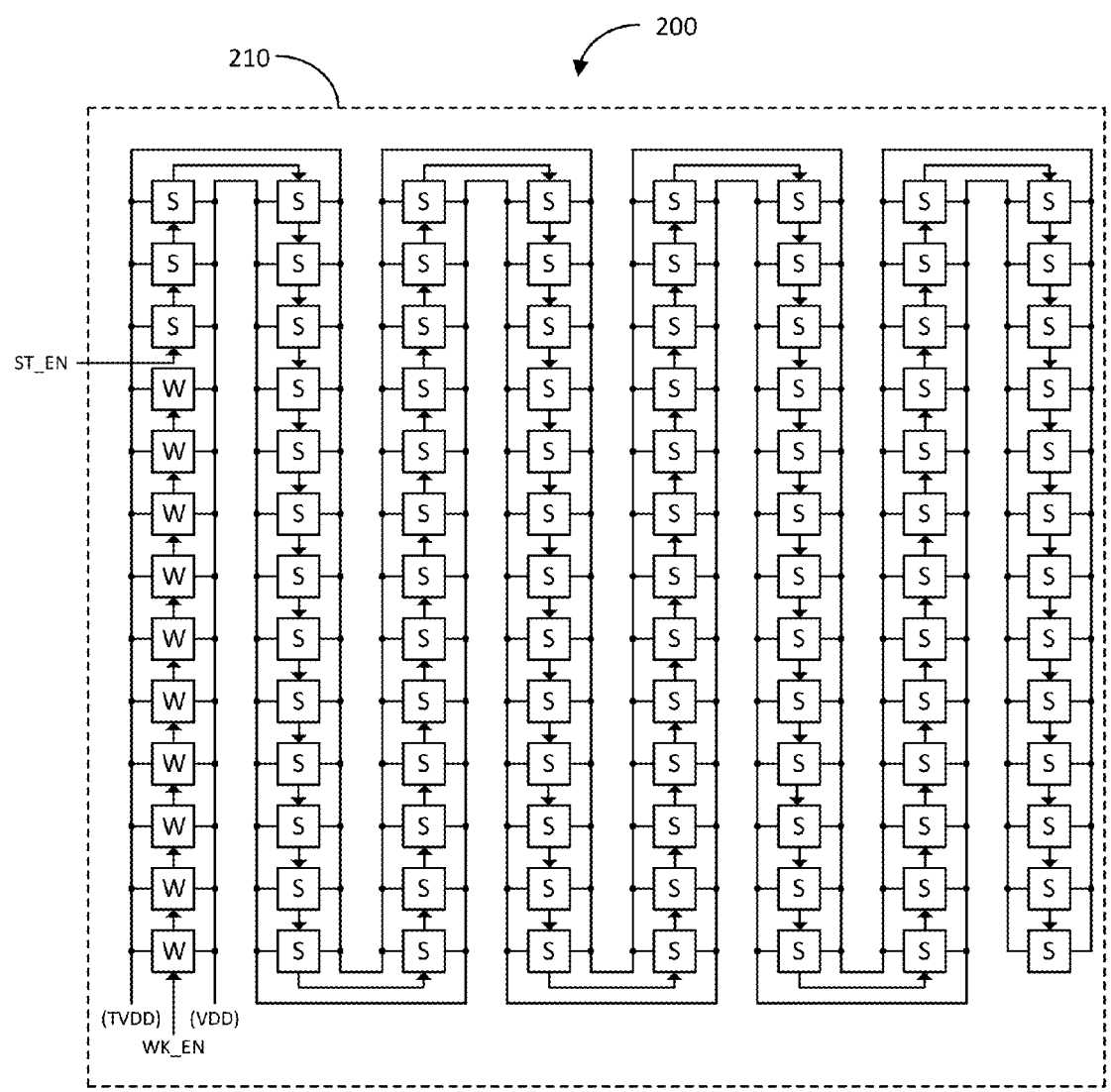
FIG. 2 illustrates a block diagram of an exemplary power gating circuit for supplying power to a portion (e.g., core or module) of an integrated circuit (IC) in accordance with another aspect of the disclosure.

FIG. 2 illustrates a block diagram of an exemplary power gating circuit 200 for supplying power to a portion (e.g., core or module) 210 of an IC in accordance with another aspect of the disclosure. The power gating circuit 200 includes a set of weak switch cells (represented by a box labeled with a "W") daisy chained together. The weak switch cells W selectively couple the terminal power rail (TVDD) to the internal power rail (VDD) in response to an enable signal WK_EN (referred to hereinafter as the weak enable signal WK_EN since it is applied to the weak switch cells).

The weak enable signal WK_EN is applied directly to the first weak switch cell W (lowest one depicted) and propagates to the other weak switch cells along the daisy-chain. Thus, when the weak enable signal WK_EN is generated (e.g., asserted), the first weak switch cell is turned on, followed by the next weak switch cell, and so on, until the last weak switch cell is turned on. As discussed in more detail further herein, each of the weak switch cells W includes a buffer (e.g., a pair of cascaded inverters), which produces a propagation delay of the weak enable signal WK_EN through each weak switch cell W. Accordingly, the weak switch cells W sequentially couple the terminal power rail (TVDD) to the internal power rail (VDD) based on the propagating weak enable signal WK_EN.

The power gating circuit 200 also includes a set of strong switch cells (represented by a box labeled with an "S") daisy chained together. The strong switch cells S also selectively couple the terminal power rail TVDD to the internal power rail VDD based on an enable signal ST_EN (referred to hereinafter as the strong enable signal ST_EN since it is applied to the strong switch cells).

The strong enable signal ST_EN is applied directly to the first strong switch S (at first column, third row as depicted) and propagates to the other strong switch cells along the daisy-chain. Thus, after the asserted weak enable signal WK_EN has turned on all of the weak switch cells W, and the initial in-rush current has peaked and then settled to well below the defined safety threshold, the strong enable signal ST_EN is generated (e.g., asserted), which begins the progressive turning on of the strong switch cells S. Similarly, each of the strong switch cells S includes a buffer (e.g., a pair of cascaded inverters), which produces a propagation delay of the strong enable signal ST_EN through each strong switch cell S. Accordingly, the strong switch cells S sequentially couple the terminal power rail (TVDD) to the internal power rail (VDD) based on the propagating strong enable signal ST_EN. The turning on of all the switch cells (weak and strong) meets the total (e.g., dynamic) current demand of the portion 210 of the IC.

Figure 3:
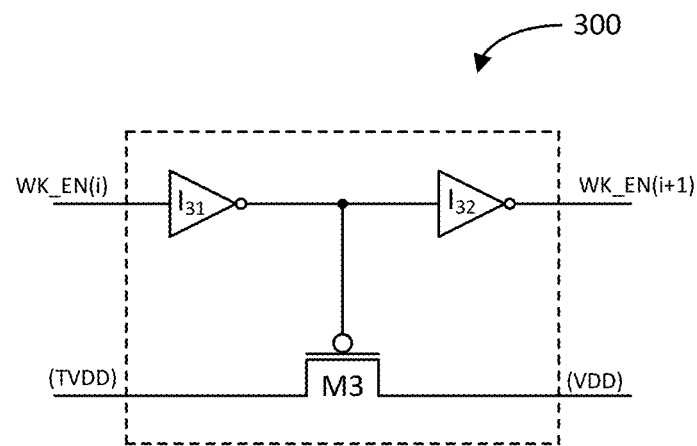
FIG. 3 illustrates a schematic diagram of an exemplary weak switch cell in accordance with another aspect of the disclosure.

FIG. 3 illustrates a schematic diagram of an exemplary weak switch cell 300 in accordance with another aspect of the disclosure. The weak switch cell 300 is an exemplary detailed implementation of any one of the weak switch cells W (such as the $i^{th}$ weak switch cell) of the power gating circuit 200 previously discussed.

In particular, the weak switch cell 300 includes a FET M3 (e.g., a p-channel metal oxide semiconductor (PMOS)) having a source coupled to the terminal power rail (TVDD) and a drain coupled to the internal power rail (VDD). The FET M3 is configured to be a relatively weak transistor (e.g., has a turn-on resistance higher than a turn-on resistance of a relatively strong transistor M4 (discussed below)).

The weak switch cell 300 further includes a first inverter $I_{31}$ having an input configured to receive the weak enable signal WK_EN(i) and an output coupled to the gate of FET M3. The weak switch cell 300 also includes a second inverter $I_{32}$ including an input coupled to the output of the first inverter $I_{31}$ and an output configured to re-generate the weak enable signal WK_EN(i+1). The inverter $I_{31}$ receives the weak enable signal WK_EN(i) directly from a source (e.g., a power gating controller) if it is the first one (i=1) in the daisy chain or receives the weak enable signal WK_EN (i) outputted by a previous weak switch cell if not the first one (if i≠1) in the daisy chain. The inverter $I_{32}$ re-generates the weak enable signal WK_EN(i+1) for a following weak switch cell in the daisy chain or may not be used if it is the last weak switch cell in the daisy chain. The pair of cascaded inverters $I_{31}$ and $I_{32}$ produces a propagation delay of the weak enable signal WK_EN.

Figure 4:
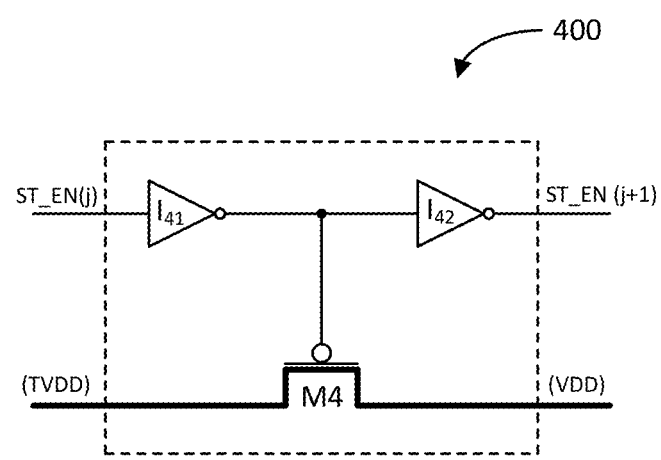
FIG. 4 illustrates a schematic diagram of an exemplary strong switch cell in accordance with another aspect of the disclosure.

FIG. 4 illustrates a schematic diagram of an exemplary strong switch cell 400 in accordance with another aspect of the disclosure. The strong switch cell 400 is an exemplary detailed implementation of any one of the strong switch cells S (such as the $j^{th}$ strong strong switch cell) of the power gating circuit 200 previously discussed.

In particular, the strong switch cell 400 includes a FET M4 (e.g., PMOS) having a source coupled to the terminal power rail (TVDD) and a drain coupled to the internal power rail (VDD). The FET M4 is configured to be a relatively strong transistor (e.g., has a turn-on resistance lower than the turn-on resistance of the weak transistor M3).

The strong switch cell 400 further includes a first inverter $I_{41}$ having an input configured to receive the strong enable signal ST_EN(j) and an output coupled to the gate of FET M4. The strong switch cell 400 also includes a second inverter $I_{42}$ including an input coupled to the output of the first inverter $I_{41}$ and an output configured to re-generate the strong enable signal ST_EN(j+1). The inverter $I_{41}$ receives the strong enable signal ST_EN(j) directly from a source (e.g., a power gating controller) if it is the first one (j=1) in the daisy chain or receives the strong enable signal ST_EN (j) outputted by a previous strong switch cell if not the first one (if j≠1) in the daisy chain. The inverter $I_{42}$ re-generates the strong enable signal ST_EN(j+1) for a following strong switch cell in the daisy chain or may not be used if it is the last strong switch cell in the daisy chain. The pair of cascaded inverters $I_{41}$ and $I_{42}$ produces a propagation delay of the strong enable signal ST_EN.

A problem with the power gating circuit 200 deals with setting the proper ratio of weak switches to strong switches in the design phase of the corresponding IC. The proper ratio is based on the final design of the portion (e.g., core or module) of the IC to which the power gating circuit 200 supplies power. However, the final design of IC portion depends on the final design of the power gating circuit 200 as the IC portion has to be properly routed to the power gating circuit and timing of the IC portion operations depends on the routing to the power gating circuit.

Because of such dependency, in the past, the ratio of weak switches to strong switches is estimated based on a predicted final design of the IC portion. In the design phase, the estimated power gating circuit design is then interfaced with the predicted IC portion design, and an analysis is made to determine whether the estimated ratio results in in-rush current peaks being acceptable (but may not be equalized). If the in-rush current peaks are acceptable, the final design is approved.

However, if the in-rush currents are not acceptable because one of the in-rush current peaks exceeds the defined safety threshold (e.g., in the case where weak switches need to be added or removed), the power gating circuit needs to be redesigned. As a consequence, the routing between the power gating circuit and the IC portion needs to be redesigned, and the timing of the IC portion operations needs to be reanalyzed and re-optimized if necessary.

The reason the routing between the power gating circuit and the IC portion needs to be redesigned is that the weak switch cell 300 has a footprint (layout configuration) that is different than the footprint of the strong switch cell 400. For instance, the weak switch cell 300 includes the weak enable signal WK_EN propagation line, and the strong switch cell 400 includes the strong enable signal ST_EN propagation line.

If, for example, the initial ratio is too small, then more weak switch cells need to be added, which will make the weak enable signal WK_EN propagation line longer and the strong enable signal ST_EN propagation line shorter. This affects the routing of (and consequently timing of) the IC portion. Conversely, if the initial ratio is too large, then some weak switch cells need to be removed, which will make the weak enable signal WK_EN propagation line shorter and the strong enable signal ST_EN propagation line longer. This likewise affects the routing of (and consequently timing of) the IC portion.

Thus, there is a need for a power gating circuit that can be redesigned or reconfigured to set the proper ratio of weak switches to strong switches while not affecting the routing of and timing of the final IC portion design.

An additional problem with the power gating circuit 200 is the requirement that all the weak switch cells W need to be daisy chained as a group in a particular location of the portion 210 of the IC. For instance, in the example of FIG. 2, the weak switch cells W are co-located along the lower-left region of the IC portion 210. Thus, the initial current resulting from the weak switch cells W turning on has to propagate from the lower-left region and disperse throughout the IC portion 210. This results in a high concentration of current in the lower-left region of the IC portion 210, which may result in damage to the IC portion 210 due to, for example, electromigration.

Thus, there is also a need for a power gating circuit that includes weak switches distributed across an area of the IC portion (e.g., in a checkerboard pattern).

Accordingly, one objective of the disclosure is to configure a weak switch cell and a strong switch cell to have substantially similar footprint (layout configuration) to allow hot swapping of a strong switch cell with a weak switch cell (or vice-versa) in the design phase without affecting routing and timing of a portion of an IC to which power is supplied by a power gating circuit having those cells.

Another objective of the disclosure is to configure the weak switch cell and the strong switch cell such that they may be daisy chained together in a mixed fashion. That is, a mixture of weak and strong switch cells daisy chained together allows for a more flexible placement of weak switch cells among the strong switch cells; or, to allow for a more distributed (e.g., checkerboard) placement of the weak switch cells across the IC area to reduce localized high current concentration; and thus, reduce the likelihood of damage to the IC due to electromigration.

The aforementioned objectives are accomplished by a new design of a weak switch cell (referred to herein as weak-strong switch cell as it is capable of both weak and strong coupling) and a new design of a strong-only switch cell.

Figure 5:
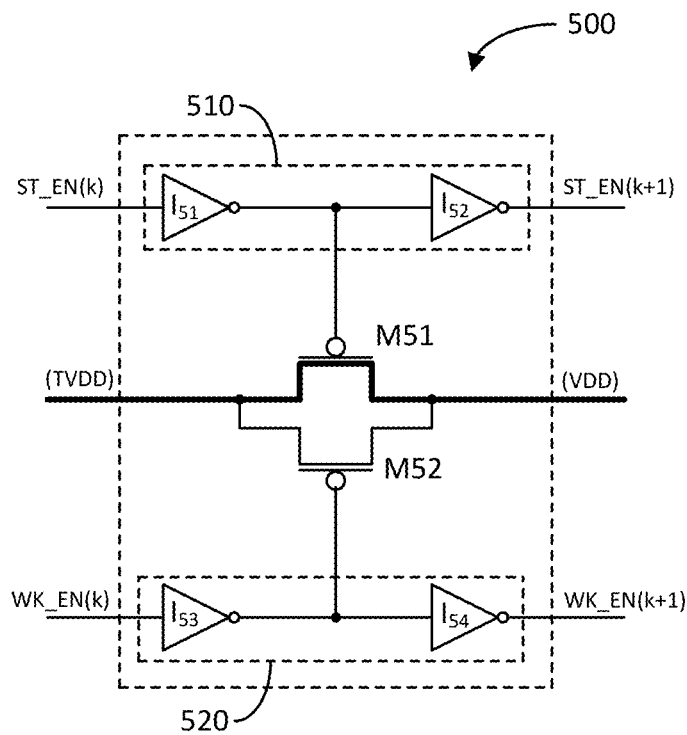
FIG. 5 illustrates a schematic diagram of an exemplary weak-strong switch cell in accordance with another aspect of the disclosure.

FIG. 5 illustrates a schematic diagram of an exemplary weak-strong switch cell 500 in accordance with another aspect of the disclosure. In this example, the weak-strong switch cell 500 may be the $k^{th}$ cell in a daisy chain of power switch cells of a power gating circuit.

In particular, the weak-strong switch cell 500 includes a relatively strong FET M51 (e.g., PMOS) having a source coupled to the terminal power rail (TVDD) and a drain coupled to the internal power rail (VDD). The weak-strong switch cell 500 includes a relatively weak FET M52 (e.g., PMOS) having a source coupled to the terminal power rail (TVDD) and a drain coupled to the internal power rail (VDD).

The weak-strong switch cell 500 further includes a first buffer 510 including a first inverter $I_{51}$ having an input configured to receive a strong enable signal ST_EN(k) and an output coupled to the control terminal (gate) of the strong FET M51. The first buffer 510 also includes a second inverter $I_{52}$ including an input coupled to the output of the first inverter $I_{51}$ and an output configured to re-generate the strong enable signal ST_EN(k+1).

The inverter $I_{51}$ receives the strong enable signal ST_EN (k) directly from a source (e.g., a power gating controller) if it is the first one (k=1) in the daisy chain or receives the strong enable signal ST_EN outputted by a previous weak-strong switch cell or a previous strong-only switch cell (depending on the type of cell that immediately precedes the weak-strong switch cell 500) if not the first one (if k≠1) in the daisy chain. The inverter $I_{52}$ re-generates the strong enable signal ST_EN(k+1) for a following weak-strong switch cell or a following strong-only switch cell in the daisy chain (depending on the type of cell that immediately follows the weak-strong switch cell 500), or may not be used if it is the last cell in the daisy chain.

The weak-strong switch cell 500 further includes a second buffer 520 including a third inverter $I_{53}$ having an input configured to receive a weak enable signal WK_EN(k) and an output coupled to the control terminal (gate) of the weak FET M52. The second buffer 520 also includes a fourth inverter $I_{54}$ having an input coupled to the output of the first inverter $I_{53}$ gate of the weak FET M5 and an output configured to re-generate the weak enable signal WK_EN(k+1).

The inverter $I_{53}$ receives the weak enable signal WK_EN (k) directly from a source (e.g., power gating controller) if it is the first one (k=1) in the daisy chain or receives the weak enable signal WK_EN(k) outputted by a previous weak-strong switch cell or a previous strong-only switch cell (depending on the type of cell that immediately precedes the weak-strong switch cell 500) if not the first one (if k≠1) in the daisy chain. The inverter $I_{54}$ re-generates the weak enable signal WK_EN(k+1) for a following weak-strong switch cell or a following strong-only switch cell in the daisy chain (depending on the type of cell that immediately follows the weak-strong switch cell 500), or may not be used if it is the last weak switch in the daisy chain.

In operation, when the asserted weak enable signal WK_EN(k) (e.g., being at a high logic voltage level (e.g., TVDD)) propagates to the weak-strong switch cell 500, the asserted weak enable signal WK_EN(k) turns on the weak FET M52 to weakly couple the terminal power rail (TVDD) to the internal power rail (VDD) during a first phase (time interval) of coupling the power rails together, as previously discussed. When the asserted strong enable signal ST_EN(k) (e.g., being a high logic voltage level (e.g., TVDD)) subsequently propagates to the weak-strong switch cell 500, the asserted strong enable signal ST_EN(k) turns on the strong FET M51 to strongly couple the terminal power rail (TVDD) to the internal power rail (VDD) during a second phase (time interval) of coupling the power rails together, as previously discussed. Thus, the weak-strong switch cell 500 operates as a weak switch during the first coupling phase and as a strong switch during the second coupling phase.

Figure 6:
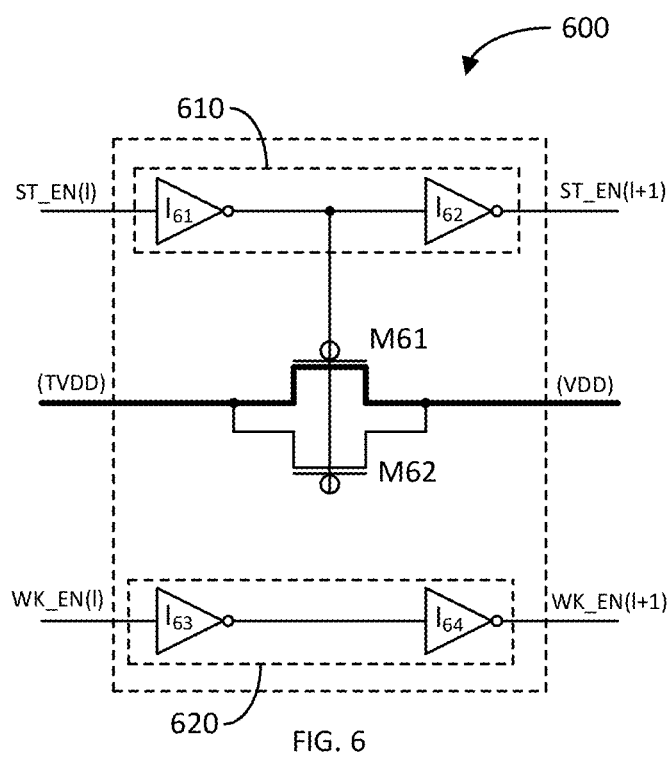
FIG. 6 illustrates a schematic diagram of an exemplary strong-only switch cell in accordance with another aspect of the disclosure.

FIG. 6 illustrates a schematic diagram of an exemplary strong-only switch cell 600 in accordance with another aspect of the disclosure. In this example, the strong-only switch cell 600 may be the $l^{th}$ cell in a daisy chain of power switch cells of a power gating circuit.

In particular, the strong-only switch cell 600 includes a relatively strong FET M61 (e.g., PMOS) having a source coupled to the terminal power rail (TVDD) and a drain coupled to the internal power rail (VDD). The strong-only switch cell 600 includes a relatively weak FET M62 (e.g., PMOS) having a source coupled to the terminal power rail (TVDD) and a drain coupled to the internal power rail (VDD).

The strong-only switch cell 600 further includes a first buffer 610 including a first inverter $I_{61}$ having an input configured to receive a strong enable signal ST_EN(l) and an output coupled to the control terminals (gates) of both the strong FET M61 and the weak FET M62. The first buffer 610 also includes a second inverter $I_{62}$ having an input coupled to the output of the first inverter $I_{61}$ and an output configured to re-generate the strong enable signal ST_EN(l+1).

The inverter $I_{61}$ receives the strong enable signal ST_EN (l) directly from a source (e.g., a power gating controller) if it is the first one (l=1) in the daisy chain or receives the strong enable signal ST_EN(l) outputted by a previous weak-strong switch or a previous strong-only switch (depending on the type of cell that immediately precedes the strong-only switch cell 600) if not the first one (if l≠1) in the daisy chain. The inverter $I_{62}$ re-generates the strong enable signal ST_EN(l+1) for a following weak-strong switch cell or a following strong-only switch cell in the daisy chain (depending on the type of cell that immediately follows the strong-only switch cell 600), or may not be used if it is the last cell in the daisy chain.

The strong-only switch cell 600 further includes a second buffer 620 including a third inverter $I_{63}$ having an input configured to receive a weak enable signal WK_EN(l) and an output coupled to an input of a fourth inverter $I_{64}$, also of the second buffer 620. The fourth inverter $I_{64}$, in turn, includes an output configured to re-generate the weak enable signal WK_EN(l+1).

The inverter $I_{63}$ receives the weak enable signal WK_EN(l) directly from a source (e.g., a power gating controller) if it is the first one (l=1) in the daisy chain or receives the weak enable signal WK_EN(l) outputted by a previous weak-strong switch or a previous strong-only switch (depending on the type of cell that immediately precedes the strong-only switch cell 600) if not the first one (if l≠1) in the daisy chain. The inverter $I_{64}$ re-generates the weak enable signal WK_EN(l+1) for a following weak-strong switch cell or a following strong-only switch cell in the daisy chain (depending on the type of cell that immediately follows the strong-only switch cell 600), or may not be used if it is the last weak switch in the daisy chain.

In operation, an asserted weak enable signal WK_EN (e.g., being at a high logic voltage level (e.g., TVDD)) propagates through the strong-only switch cell 600 without affecting the operation of the strong and weak FETs M61 and M62. Thus, the strong-only switch cell 600 is just a delay element or pass-through for the weak enable signal WK_EN(l). Therefore, the strong-only switch 600 may only be used in the second phase of coupling the terminal power rail (TVDD) to the internal power rail (VDD).

When an asserted strong enable signal ST_EN(l) (e.g., being at a high logic voltage level (e.g., TVDD)) propagates to the strong-only switch cell 600, the asserted strong enable signal ST_EN(l) turns on both the strong FET M61 and the weak FET M62 to strongly couple the terminal power rail (TVDD) to the internal power rail (VDD) during the second phase of coupling the power rails together, as previously discussed.

As discussed in more detail herein, since the configurations of the weak-strong switch cell 500 and the strong-only switch cell 600 are almost identical, the corresponding footprint (layout configuration) may be made substantially the same. That is, from an input-output perspective, the weak-strong switch cell 500 is identical to the strong-only switch cell 600. For instance, both cells 500 and 600 each include a first input to receive the strong enable signal ST_EN, a first output to produce the re-generated strong enable signal ST_EN, a second input for coupling to the terminal power rail (TVDD) and a second output for coupling to the internal power rail (VDD), and a third input to receive the weak enable signal WK_EN, and a third output to produce the re-generated weak enable signal WK_EN.

Thus, in the design phase of a power gating circuit, a strong-only switch cell 600 may be "hot swapped" for a weak-strong switch cell 500 (or vice-versa) while designing the power gating circuit to achieve the proper ratio of weak switches to strong switches without requiring re-routing and/or timing analysis of the portion (e.g., core or module) of the IC to which power will be supplied by the power gating circuit.

Further, because both the weak-strong switch cell 500 and the strong-only switch cell 600 have the same input and output configurations, the weak-strong switch cell 500 and the strong-only switch cell 600 may be daisy chained together. This allows a more flexible manner of placing weak switches and strong switches across an IC area, as desired. For example, weak-strong switch cells 500 may be distributed in a checkerboard pattern across the entire area of the corresponding core or module to which power is supplied.

Figure 7:
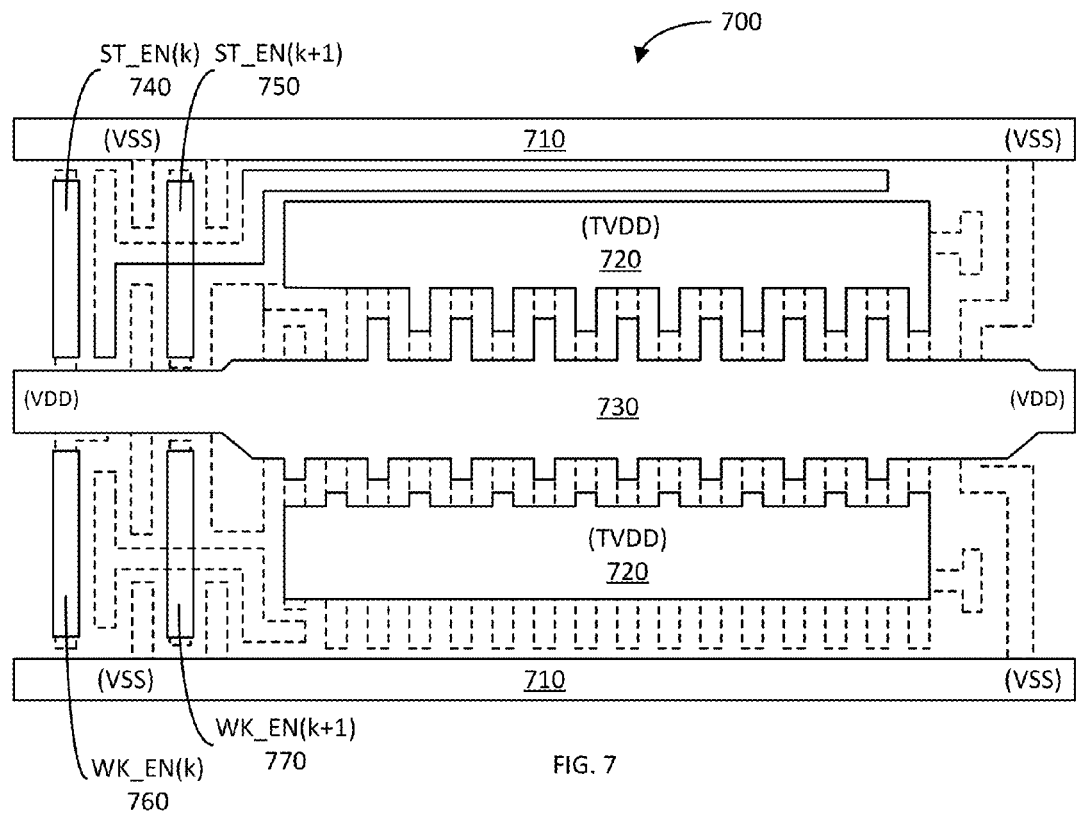
FIG. 7 illustrates a top view of a footprint (layout configuration) of an exemplary weak-strong switch cell in accordance with another aspect of the disclosure.

FIG. 7 illustrates a top view of a footprint (layout configuration) of an exemplary weak-strong switch cell 700 in accordance with another aspect of the disclosure. The layout configuration of the weak-strong switch cell 700 may be an example of a layout configuration for the weak-strong switch cell 500 previously discussed.

As illustrated, the weak-strong switch cell 700 includes top and bottom horizontal metallization traces serving as a power rail (VSS) 710 (e.g., ground) for the weak-strong switch cell 700. Via internal metallization traces (represented by dashed lines), the power rail (VSS) 710 may be coupled to sources of n-channel metal oxide semiconductor (NMOS) FETs (not shown) used in the inverters $I_{51}$, $I_{52}$, $I_{53}$, and $I_{54}$.

The weak-strong switch cell 700 further includes a central horizontal metallization trace 730 serving as the internal power rail (VDD). Via internal metallization traces, the internal power rail (VDD) is coupled to the drains of the weak and strong FETs M51 and M52. Also, via internal metallization traces, the internal power rail (VDD) is coupled to sources of PMOS FETs (not shown) used in the inverters $I_{51}$, $I_{52}$, $I_{53}$, and $I_{54}$.

The weak-strong switch cell 700 further includes a pair of horizontal metallization traces 720 serving as the terminal power rail (TVDD). One of the pair of metallization traces 720 is situated between the top power rail (VSS) metallization trace 710 and the internal power rail (VDD) metallization trace 730. The other one of the pair of metallization traces 720 is situated between the bottom power rail (VSS) metallization trace 710 and the internal power rail (VDD) metallization trace 730. Via internal metallization traces, the terminal power rail (TVDD) is coupled to the sources of the weak and strong FETs M51 and M52.

The weak-strong switch cell 700 further includes a metallization trace 740 for receiving the strong enable signal ST_EN(k), and a metallization trace 750 for producing the regenerated strong enable signal ST_EN(k+1). Via internal metallization traces, the strong enable signal ST_EN(k) is coupled to the gates of the corresponding PMOS and NMOS of inverter $I_{51}$. Via internal metallization traces, the drains of the PMOS and NMOS of inverter $I_{51}$ are coupled to the control terminal (gate) of the strong FET M51. Via internal metallization traces, the gates of the PMOS and NMOS of inverter $I_{52}$ are coupled to the drains of PMOS and NMOS of inverter $I_{51}$. And, the regenerated strong enable signal ST_EN(k+1) is produced at the drains of the PMOS and NMOS of inverter $I_{52}$.

Similarly, the weak-strong switch cell 700 further includes a metallization trace 760 for receiving the weak enable signal WK_EN(k), and a metallization trace 770 for producing the regenerated strong enable signal WK_EN(k+1). Via internal metallization traces, the weak enable signal WK_EN(k) is coupled to the gates of the corresponding PMOS and NMOS of inverter $I_{53}$. Via internal metallization traces, the drains of the PMOS and NMOS of inverters $I_{53}$ are coupled to the control terminal (gate) of the weak FET M52. Via internal metallization traces, the gates of the PMOS and NMOS of inverter $I_{54}$ are coupled to the drains of the PMOS and NMOS of inverter $I_{53}$. And, the regenerated weak enable signal WK_EN(k+1) is produced at the drains of the PMOS and NMOS of inverter $I_{54}$.

Figure 8:
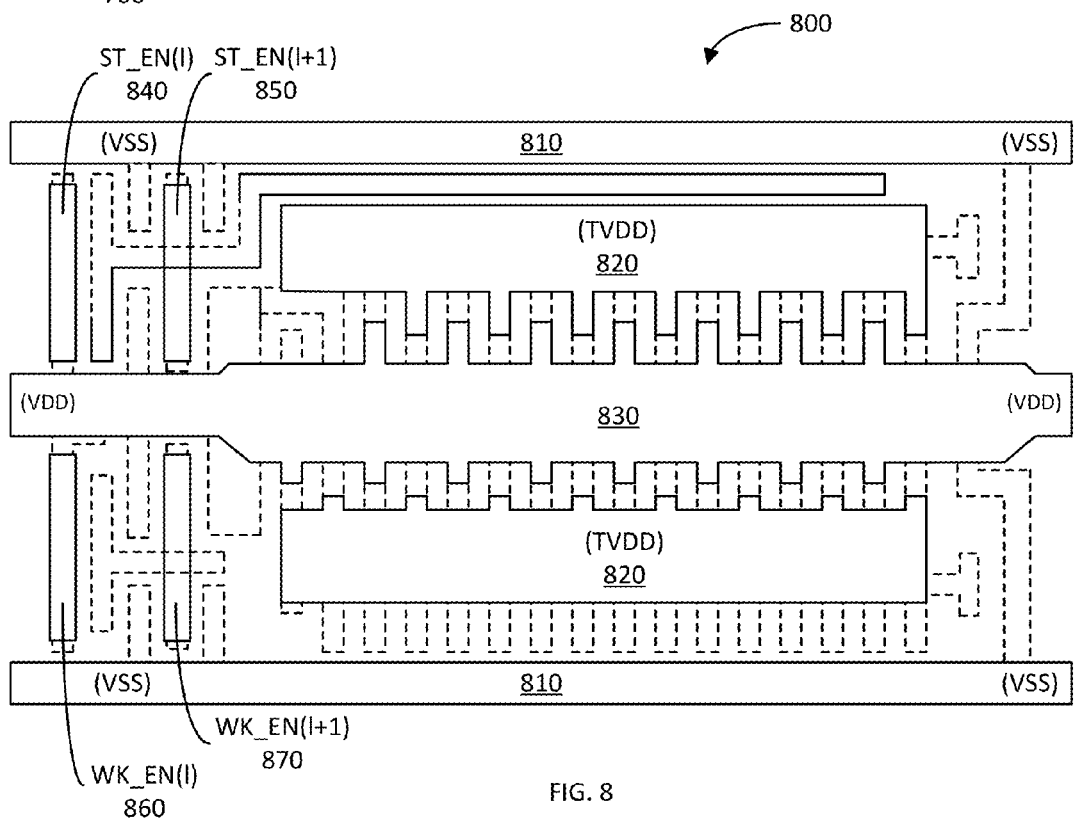
FIG. 8 illustrates a top view of a footprint (layout configuration) of an exemplary strong-only switch cell in accordance with another aspect of the disclosure.

FIG. 8 illustrates a top view of a footprint (layout configuration) of an exemplary strong-only cell 800 in accordance with another aspect of the disclosure. The layout configuration of the strong-only switch cell 800 may be an example of a layout configuration for the strong-only switch cell 600 previously discussed.

As illustrated, the strong-only switch cell 800 includes top and bottom horizontal metallization traces serving as a power rail (VSS) 810 (e.g., ground) for the strong-only switch cell 800. Via internal metallization traces (represented by dashed lines), the power rail (VSS) 810 may be coupled to sources of NMOS FETs (not shown) used in the inverters $I_{61}$, $I_{62}$, $I_{63}$, and $I_{64}$.

The strong-only switch cell 800 further includes a central horizontal metallization trace 830 serving as the internal power rail (VDD). Via internal metallization traces, the internal power rail (VDD) is coupled to the drains of the weak and strong FETs M61 and M62. Also, via internal metallization traces, the internal power rail (VDD) is coupled to sources of PMOS FETs (not shown) used in the inverters $I_{61}$, $I_{62}$, $I_{63}$, and $I_{64}$.

The strong-only switch cell 800 further includes a pair of horizontal metallization traces 820 serving as the terminal power rail (TVDD). One of the pair of metallization traces 820 is situated between the top power rail (VSS) metallization trace 810 and the internal power rail (VDD) metallization trace 830. The other one of the pair of metallization traces 820 is situated between the bottom power rail (VSS) metallization trace 810 and the internal power rail (VDD) metallization trace 830. Via internal metallization traces, the terminal power rail (TVDD) is coupled to the sources of the weak and strong FETs M61 and M62.

The strong-only switch cell 800 further includes a metallization trace 840 for receiving the strong enable signal ST_EN(l), and a metallization trace 850 for producing the regenerated strong enable signal ST_EN(l+1). Via internal metallization traces, the strong enable signal ST_EN(l) is coupled to the gates of the PMOS and NMOS of inverter $I_{61}$. Via internal metallization traces, the drains of the PMOS and NMOS of inverters $I_{61}$ are coupled to the control terminals (gates) of the strong and weak FETs M61 and M62. Via internal metallization traces, the gates of the PMOS and NMOS of inverter $I_{62}$ are coupled to the drains of the PMOS and NMOS of inverter $I_{61}$. And, the regenerated strong enable signal ST_EN(l+1) is produced at the drains of the PMOS and NMOS of inverter $I_{62}$.

Similarly, the strong-only switch cell 800 further includes a metallization trace 860 for receiving the weak enable signal WK_EN(l), and a metallization trace 870 for producing the regenerated weak enable signal WK_EN(l+1). Via internal metallization traces, the weak enable signal WK_EN(l) is coupled to the gates of the PMOS and NMOS of inverter $I_{63}$. Via internal metallization traces, the gates of the PMOS and NMOS of inverter $I_{64}$ are coupled to the drains of the PMOS and NMOS of inverter $I_{63}$. And, the regenerated weak enable signal WK_EN(l+1) is produced at the drains of the PMOS and NMOS of inverter $I_{64}$.

A comparison of the footprint (layout configuration) of the weak-strong switch cell 700 and the footprint (layout configuration) of the strong-only switch cell 800 indicates that both cells are substantially the same. For example, from an input and output perspective, both cells 700 and 800 are the same. That is, both cells 700 and 800 include: the same configured metallization traces 710 and 810 for the power rail (VSS); the same configured metallization traces 820 for the terminal power rail (TVDD); the same configured metallization traces 830 for the internal power rail (VDD); the same configured metallization traces for receiving the strong enable signals ST_EN(k) and ST_EN(l); the same configured metallization traces for producing the regenerated strong enable signals ST_EN(k+1) and ST_EN(l+1); the same configured metallization traces for receiving the weak enable signals WK_EN(k) and WK_EN(l); and the same configured metallization traces for producing the regenerated weak enable signals WK_EN(k+1) and WK_EN(l+1).

Thus, replacing ("hot swapping") the weak-strong switch cell 700 by the strong-only switch cell 800 or vice-versa in the design phase of a power gating circuit does not affect routing between the power gating circuit and the portion of the IC to which power is supplied by the power gating circuit.

Furthermore, the size and layout of the weak-strong switch cell 700 and the strong-only switch cell 800 are substantially similar with the following minor differences in their respective internal metallization traces: (1) In the weak-strong switch cell 700, internal metallization traces electrically connect the outputs of inverters $I_{51}$ and $I_{53}$ to the gates of FETs M51 and M52, respectively; and (2) In the strong-only switch cell 800, internal metallization traces electrically connect only the output of inverter $I_{61}$ to the gates of FETs M61 and M62 (and not the output of inverter $I_{63}$ to the gates of FETs M61 and M62).

Because the size and layout of the cells 700 and 800 are substantially similar, they both exhibit substantially the same parasitic reactance from the perspective of the portion of the IC to which the cells are connected. Thus, replacing ("hot swapping") the weak-strong switch cell 700 by the strong-only switch cell 800 or vice-versa in the design phase of a power gating circuit does not affect the timing operation of the portion of the IC to which power is supplied by the power gating circuit.

Figure 9:
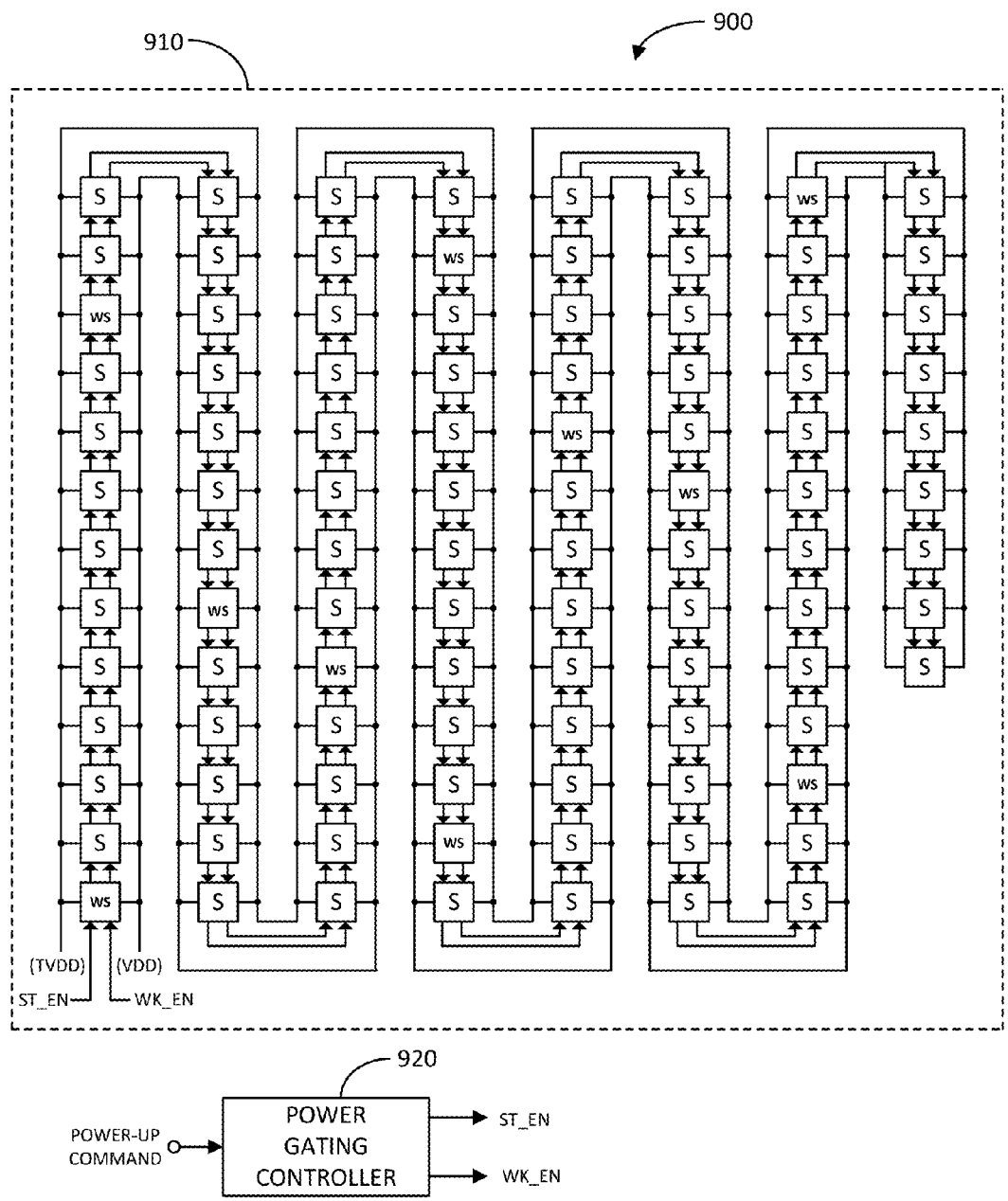
FIG. 9 illustrates a block diagram of an exemplary power gating circuit for supplying power to a portion (e.g., core or module) of an integrated circuit (IC) in accordance with another aspect of the disclosure.

FIG. 9 illustrates a schematic diagram of an exemplary power gating circuit 900 for a portion 910 (e.g., core or module) of an IC in accordance with another aspect of the disclosure. The power gating circuit 900 includes a daisy chain having a mixture of weak-strong switch cells WS and strong-only switch cells S. Each of the weak-strong switch cells WS may be configured similar to the weak-strong switch cells 500 and/or 700 previously discussed. Each of the strong-only switch cells S may be configured similar to the strong-only switch cells 600 and/or 800 previously discussed.

Each of the cells WS and S is coupled between the terminal power rail (TVDD) and the internal power rail (VDD). Each of the cells WS and S receives the strong enable signal ST_EN and the weak enable signal WK_EN from a power gating controller 920 if it is the first cell in the daisy chain or from a previous cell if it is not the first cell in the daisy chain. With the exception of the last switch cell in the daisy chain, each of the cells WS and S passes the strong enable signal ST_EN and the weak enable signal WK_EN to the following cell in the daisy chain.

In this example, the power gating circuit 900 includes a total of 100 switch cells S and WS. Out of the 100 cells, there are 90 strong-only switch cells S and 10 weak-strong switch cells WS. The total number of cells (e.g., 100 cells) is selected to meet the total current demand (e.g., the dynamic current demand) of the IC portion 910. In this example, the ratio of weak switches to strong switches is 10 percent. Again, as discussed, the ratio is selected to substantially equalize the in-rush current peaks due to the turning on of the weak switches followed by the turning on of the strong switches.

Further, in this example, the first cell in the daisy chain is a weak-strong cell WS. Accordingly, the strong enable signal ST_EN and WK_EN are applied to this first weak-strong cell WS. Following the first cell in the daisy chain, there are a series of strong-only cells (e.g. nine (9)) before another weak-strong switch cell WS is encountered. This daisy chain configuration (one (1) weak-strong switch cell WS followed by nine (9) strong-only switch cells S) is repeated 10 times in the power gating circuit 900 to achieve the total of 100 switch cells, with 10 of them being weak-strong switch cells WS and 90 of them being strong-only switch cells S.

As illustrated, the weak-strong switch cells WS are distributed substantially across the entire area of the portion 910 of the IC. This reduces current concentration that would otherwise result if all weak switch cells were co-located in a particular area, such as in power gating circuit 200 previously discussed.

In operation, in response to receiving a command to power up the portion 910 of the IC, the power gating controller 920 generates (e.g., asserts) the weak enable signal (WK_EN) (e.g., sets the signal WK_EN to a logic high voltage level (e.g., TVDD)). The asserted weak enable signal WK_EN progressively turns on the weak FET M52 as it encounters each weak-strong switch cell WS as it propagates through the daisy chain. The strong-only cells S do not turn on in response to the asserted weak-enable signal WK_EN because the strong-only cells merely pass the signal through. The turning on of the weak-strong cells WS progressively couples the terminal power rail (TVDD) to the internal power rail (VDD) to limit the in-rush current peak to below a defined safety threshold.

After a defined time interval of the assertion of the weak enable signal WK_EN (e.g., sufficient time interval for the first in-rush current to settle to a defined level below the defined safety threshold), the power gating controller 920 generates (e.g., asserts) the strong enable signal ST_EN (e.g., sets the signal ST_EN to a logic high voltage level (e.g., TVDD)). The asserted strong enable signal ST_EN progressively turns on the strong FET M51 as it encounters each weak-strong switch cell WS as it propagates through the daisy chain, and the strong and weak FETs M61 and M62 as it encounters each strong-only switch cell S as it propagates through the daisy chain. As the internal power rail (VDD) has already been pre-charged by the turning on of the weak FETs M52 in the weak-strong switch cells WS in response to the asserted weak enable signal WK_EN, the turning on of the strong-only cells S progressively and fully couples the terminal power rail (TVDD) to the internal power rail (VDD) such that the second in-rush current peak is also below the defined safety threshold.

Figure 10:
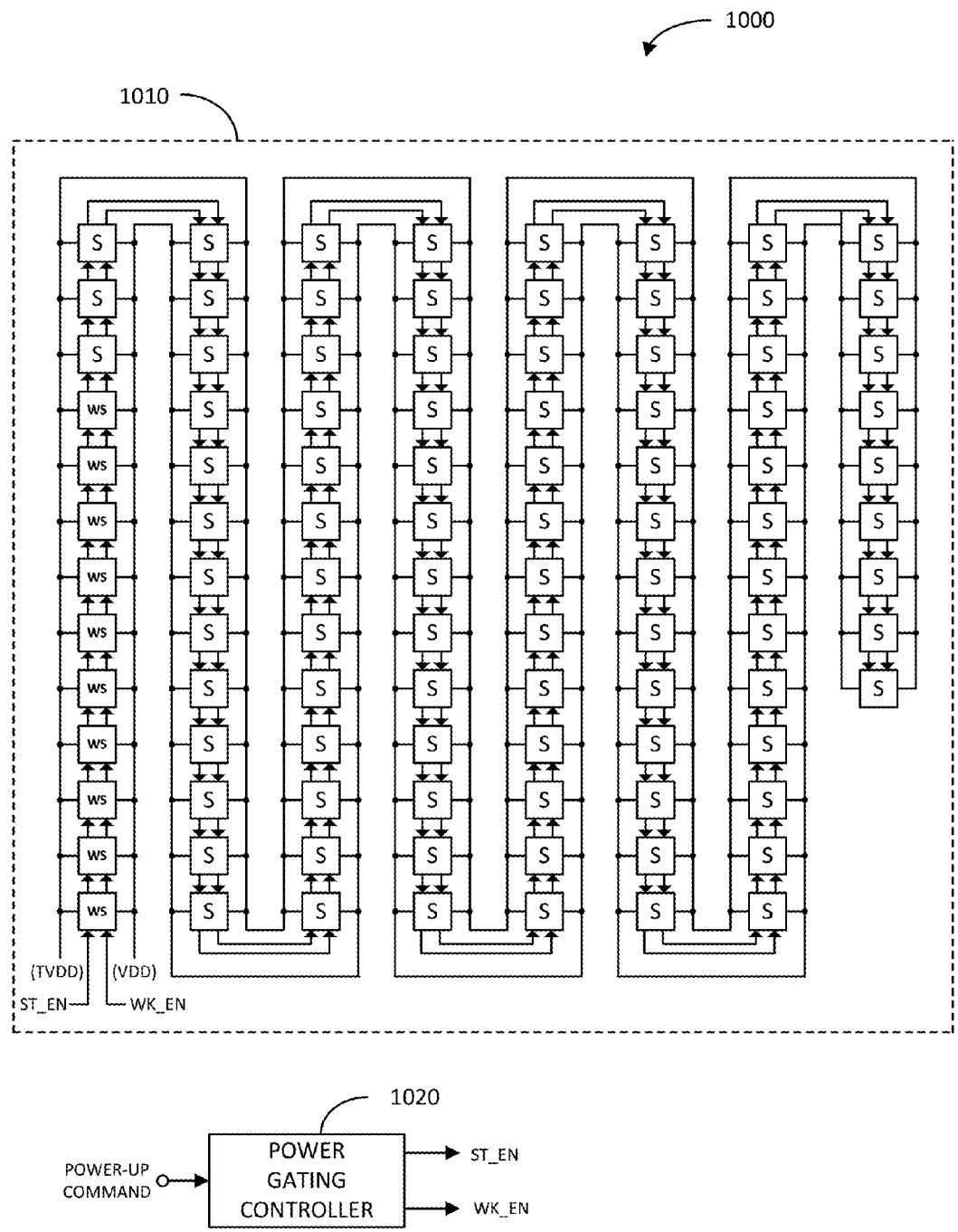
FIG. 10 illustrates a block diagram of another exemplary power gating circuit for supplying power to a portion (e.g., core or module) of an integrated circuit (IC) in accordance with another aspect of the disclosure.

FIG. 10 illustrates a schematic diagram of an exemplary power gating circuit 1000 for supplying power to a portion 1010 (e.g., core or module) of an IC in accordance with another aspect of the disclosure. The power gating circuit 1000 includes a daisy chain having a mixture of 90 strong-only switch cells S and 10 weak-strong switch cells WS. As illustrated, the 10 weak-strong switch cells WS are daisy chained together in a uniform group (lower left side) and the remaining strong-only switch cells S are daisy chained in a uniform group following the weak-strong switches WS. This is to illustrate that the placement of weak-strong switch cells WS and strong-only switch S may be as desired across the entire area of the portion 1010 of the IC.

The power up operation is similar to that of power gating circuit 900. In response to receiving a command to power up the portion 1010 of the IC, a power gating controller 1020 generates (e.g., asserts) the weak enable signal WK_EN, which causes the weak FETs M52 of the weak-strong switch cells WS to progressively couple the terminal power rail (TVDD) to the internal power rail (VDD). Then, after a defined time interval of the assertion of the weak enable signal WK_EN, the power gating controller 1020 generates (e.g., asserts) the strong enable signal ST_EN, which causes the strong FETs M51 and M61 of the weak-strong switch cells WK and the strong-only cells (as well as the weak FETs M62 of the strong-only switch cells S) to further progressively couple the terminal power rail (TVDD) to the internal power rail (VDD).

Figure 11:
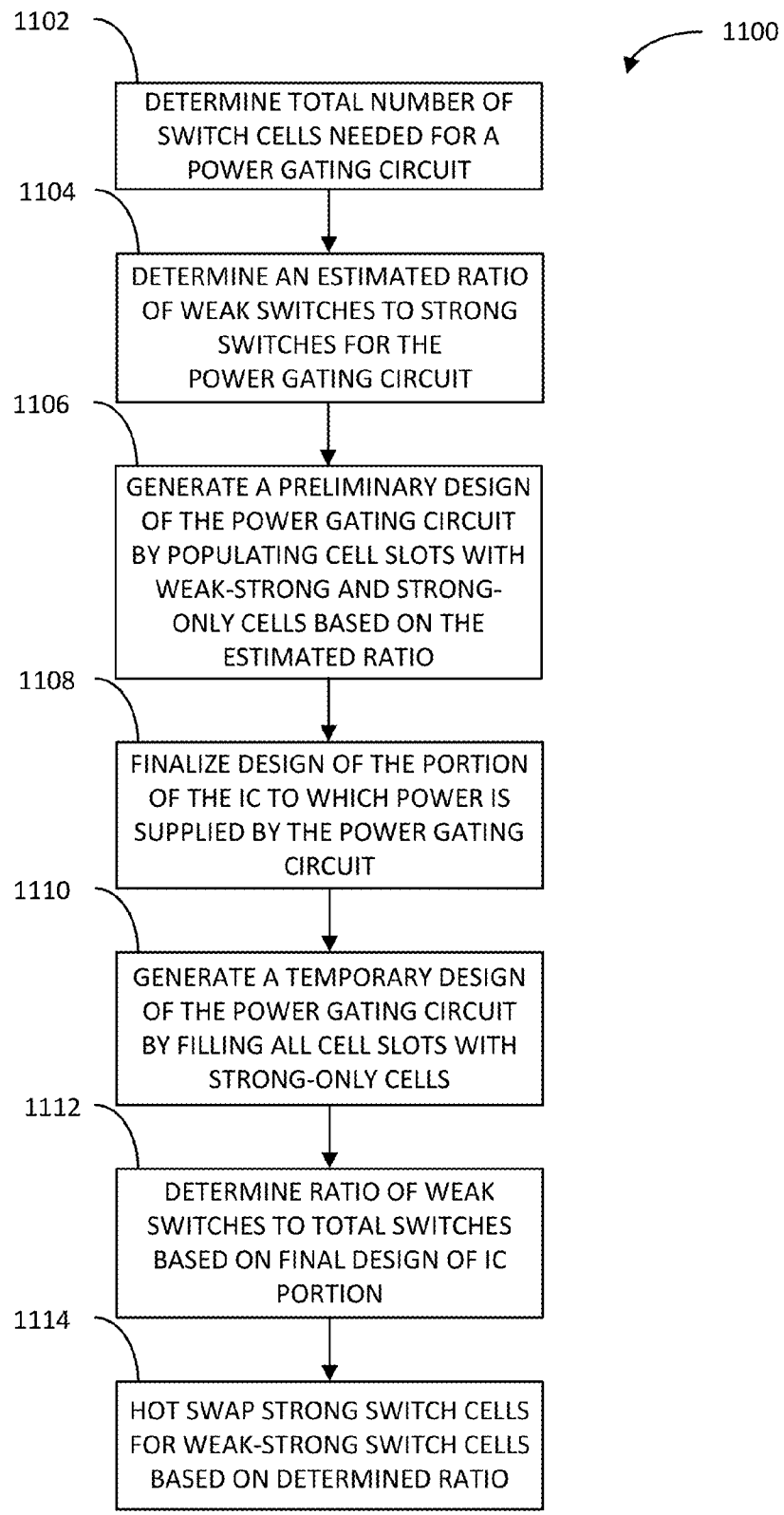
FIG. 11 illustrates a flow diagram of an exemplary method of designing a power gating circuit in accordance with another aspect of the disclosure.

FIG. 11 illustrates a flow diagram of an exemplary method 1100 of designing a power gating circuit in accordance with another aspect of the disclosure. The method 1100 includes determining a total number of switch cells for the power gating circuit design (block 1102). The total number of switch cells may be determined based on the total current demand (e.g., the dynamic current) for a portion (e.g., core or module) of an IC to which the power gating circuit will supply power.

Additionally, the method 1100 includes determining an estimated ratio of weak switches to strong switches for the power gating circuit design (block 1104). As previously discussed, this ratio may depend on various factors, including the size, circuit density, and routing congestion of the portion of the IC to which the power gating circuit will supply power. A design tool may be used to determine such estimated ratio. As previously discussed, the ratio of weak switches to strong switches is estimated in order to achieve substantially equalized in-rush current peaks that are below a defined safety threshold.

Then, the method 1100 further entails generating a preliminary design of the power gating circuit by populating cell slots with the weak-strong switch cells WS and strong-only switch cells S based on the estimated ratio (block 1106). For example, if the estimated ratio is 10 percent and there are 100 total switch cells in the power gating circuit design, then 10 cell slots are populated with the weak-strong switch cell WS and 90 cell slots are populated with the strong-only switch cell S. For a balanced distribution of the weak-strong switch cells WS among the strong-only switch cells S, every $10^{th}$ slot may be populated with a weak-strong switch cell WS. The preliminary design of the power gating circuit may be in a format used for generating masks for manufacturing the IC, such as Global Database System II (GDSII) format, OASIS, as well as others.

Then, according to the method 1100, the design of the portion (e.g., core or module) of the IC to which power will be supplied by the power gating circuit is finalized (block 1108). This may entail designing the routing between the power gating circuit and portion of the IC, as well as performing timing analysis and optimization based on the designed routing.

The method 1100 further includes generating a temporary design of the power gating circuit by populating all the cell slots with strong-only switch cells S (block 1110). Then, according to the method 1100, the final ratio of weak switches to strong switches is determined based on the final design of the portion (e.g., core or module) of the IC (block 1112). The final ratio may be different than the estimated ratio determined in block 1104.

Then, according to the method 1100, some of the strong-only switch cells S are replaced ("hot swapped" with) by weak-strong switch cells WS based on the final ratio (block 1114). For example, if the final ratio is nine (9), then, for a balanced distribution of weak-strong switch cells WS among the strong-only switch cells S, every $9^{th}$ strong-only switch cell is "hot swapped" with a weak-strong switch cell WS. Because both types of switch cells S and WS are footprint compatible, the hot swapping of the strong-only switch cells S with the weak-strong switch cells WS does not affect routing or the timing operation of the portion (e.g., core or module) of the IC.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a set of first switch cells, wherein each of the first switch cells is configured to couple a first power rail to a second power rail via a first relatively weak transistor in response to a first enable signal, and couple the first power rail to the second power rail via a first relatively strong transistor in response to a second enable signal; and
   a set of second switch cells, wherein each of the second switch cells is configured to couple the first power rail to the second power rail via a second relatively weak transistor and a second relatively strong transistor in response to the second enable signal.

2. The apparatus of claim 1, wherein a layout configuration of the first switch cell is substantially the same as a layout configuration of the second switch cell.

3. The apparatus of claim 1, wherein each of the first switch cells comprise:
   a first inverter including a first input configured to receive the first enable signal, and a first output coupled to a control terminal of the first relatively weak transistor; and
   a second inverter including a second input coupled to the first output of the first inverter and the control terminal of the first relatively weak transistor, and a second output configured to regenerate the first enable signal.

4. The apparatus of claim 1, wherein each of the first switch cells comprise:
   a first inverter including a first input configured to receive the second enable signal, and a first output coupled to a control terminal of the first relatively strong transistor; and
   a second inverter including a second input coupled to the first output of the first inverter, and a second output configured to regenerate the second enable signal.

5. The apparatus of claim 1, wherein each of the second switch cells comprise:
   a first inverter including a first input configured to receive the second enable signal, and a first output coupled to respective control terminals of the second relatively strong transistor and the second relatively weak transistor; and
   a second inverter including a second input coupled to the first output of the first inverter, and a second output configured to regenerate the second enable signal.

6. The apparatus of claim 1, wherein each of the second switch cells includes a buffer configured to receive and pass through the first enable signal.

7. The apparatus of claim 1, wherein each of the second switch cells comprise:
   a first inverter including a first input configured to receive the first enable signal; and
   a second inverter including a second input coupled to a first output of the first inverter, and a second output configured to regenerate the first enable signal.

8. The apparatus of claim 1, wherein the set of first switch cells are daisy chained with the set of second switch cells.

9. The apparatus of claim 1, wherein the set of first switch cells are daisy chained with the set of second switch cells in a manner that a first subset of the second switch cells precede at least one of the first switch cells, and a second subset of the second switch cells follow the at least one of the first switch cells.

10. The apparatus of claim 1, wherein the set of first switch cells are daisy chained with the set of second switch cells in a manner that all of the set of first switch cells precede all of the set of second switch cells.

11. The apparatus of claim 1, further comprising a controller configured to generate the first enable signal and the second enable signal in response to a command.

12. The apparatus of claim 11, wherein the controller is configured to generate the second enable signal after a defined time interval of the generation of the first enable signal.

13. The apparatus of claim 1, wherein the first relatively strong transistor comprises a turn-on resistance that is lower relative to the turn-on resistance of the first relatively weak transistor, and
   wherein the second relatively strong transistor comprises a turn-on resistance that is lower relative to the turn-on resistance of the second relatively weak transistor.

14. An apparatus, comprising:
   first means for coupling a first power rail to a second power rail via a first relatively weak transistor in response to a first enable signal, and coupling the first power rail to the second power rail via a first relatively strong transistor in response to a second enable signal; and
   second means for coupling the first power rail to the second power rail via a second relatively weak transistor and a second relatively strong transistor in response to the second enable signal.

15. The apparatus of claim 14, wherein the first coupling means and the second coupling means are daisy chained together.

16. The apparatus of claim 14, further comprising means for generating the second enable signal after a defined time interval of generating the first enable signal.

* * * * *